US009865489B2

(12) United States Patent
West et al.

(10) Patent No.: US 9,865,489 B2
(45) Date of Patent: Jan. 9, 2018

(54) SUBSTRATE SUPPORT CHUCK COOLING FOR DEPOSITION CHAMBER

(71) Applicant: APPLIED MATERIALS, INC., Santa Clara, CA (US)

(72) Inventors: Brian West, San Jose, CA (US); Vijay Parkhe, San Jose, CA (US); Robert Hirahara, San Jose, CA (US); Dan Deyo, Cedar Park, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/498,739

(22) Filed: Apr. 27, 2017

(65) Prior Publication Data

US 2017/0229334 A1    Aug. 10, 2017

Related U.S. Application Data

(62) Division of application No. 14/187,747, filed on Feb. 24, 2014, now Pat. No. 9,668,373.

(60) Provisional application No. 61/788,508, filed on Mar. 15, 2013.

(51) Int. Cl.
| | |
|---|---|
| *H01L 21/683* | (2006.01) |
| *H01T 21/00* | (2006.01) |
| *G03G 15/02* | (2006.01) |
| *H01L 21/67* | (2006.01) |
| *C23C 14/54* | (2006.01) |
| *C23C 14/50* | (2006.01) |

(52) U.S. Cl.
CPC .......... *H01L 21/6833* (2013.01); *C23C 14/50* (2013.01); *C23C 14/541* (2013.01); *H01L 21/67109* (2013.01)

(58) Field of Classification Search
CPC ............. H01L 21/6831; H01L 21/6833; H01L 21/67103
USPC ........................................................ 361/234
See application file for complete search history.

(56) References Cited

U.S. PATENT DOCUMENTS

| | | |
|---|---|---|
| 5,158,128 A | 10/1992 | Inoue et al. |
| 5,192,849 A | 3/1993 | Moslehi |
| 6,081,414 A | 6/2000 | Flanigan et al. |
| 6,664,738 B2 | 12/2003 | Arai et al. |
| 6,669,783 B2 | 12/2003 | Sexton et al. |
| 7,045,045 B2 | 5/2006 | Natsuhara et al. |
| 8,075,729 B2 | 12/2011 | Holland et al. |

(Continued)

OTHER PUBLICATIONS

International Search Report and Written Opinion dated Jun. 2, 2014 for PCT Application No. PCT/US2014/020272.

*Primary Examiner* — Thienvu Tran
*Assistant Examiner* — Lucy Thomas
(74) *Attorney, Agent, or Firm* — Moser Taboada; Alan Taboada

(57) ABSTRACT

A substrate support chuck for use in a substrate processing system is provided herein. In some embodiments, a substrate support for use in a substrate processing chamber may include an electrostatic chuck having a top substrate support surface and a bottom surface, and a cooling ring assembly having a central opening disposed proximate the bottom surface of the electrostatic chuck, the cooling ring assembly including, a cooling section having a top surface thermally coupled to the bottom surface of the electrostatic chuck, the cooling section having a cooling channel formed in a bottom surface of the cooling section, and a cap coupled to a bottom surface of the cooling section and fluidly sealing the cooling channel formed in the cooling section.

18 Claims, 3 Drawing Sheets

(56) References Cited

U.S. PATENT DOCUMENTS

| | | |
|---|---|---|
| 2002/0129475 A1 | 9/2002 | Tsai et al. |
| 2003/0164226 A1 | 9/2003 | Kanno et al. |
| 2004/0009649 A1 | 1/2004 | Kub et al. |
| 2006/0102613 A1 | 5/2006 | Kuibira et al. |
| 2007/0258186 A1 | 11/2007 | Matyushkin et al. |
| 2008/0023926 A1 | 1/2008 | Kim |

SUBSTRATE SUPPORT CHUCK COOLING FOR DEPOSITION CHAMBER

CROSS-REFERENCE TO RELATED APPLICATIONS

This application is a divisional of co-pending U.S. patent application Ser. No. 14/187,747, filed Feb. 24, 2014, which claims benefit of U.S. provisional patent application Ser. No. 61/788,508, filed Mar. 15, 2013. Each of the aforementioned related patent applications is herein incorporated by reference in its entirety.

FIELD

Embodiments of the present invention generally relate to semiconductor processing.

BACKGROUND

The inventors have observed that conventional high temperature substrate support chuck for certain applications are not capable of controlling the heat input created by lengthy heavy deposition rate processes such as LED backside deposition of gold (Au) or Gold-tin (AuSn), thick aluminum, or some microelectromechanical systems (MEMS) processes. For example, where typical 150 mm semiconductor Physical Vapor Deposition (PVD) processes are less than 1 minute long at elevated temperatures, the LED backside deposition processes, for example, are approximately 6 minutes long and must be maintained at relatively low temperatures. However, the increased heat input to the wafer and chuck exceeds what some conventional chucks can manage.

Therefore, the inventors have provided embodiments of an improved substrate support chuck.

SUMMARY

Embodiments of a substrate support chuck for use in a substrate processing system is provided herein. In some embodiments, a substrate support for use in a substrate processing chamber may include an electrostatic chuck having a top substrate support surface and a bottom surface, and a cooling ring assembly having a central opening disposed proximate the bottom surface of the electrostatic chuck, the cooling ring assembly including, a cooling section having a top surface thermally coupled to the bottom surface of the electrostatic chuck, the cooling section having a cooling channel formed in a bottom surface of the cooling section, and a cap coupled to a bottom surface of the cooling section and fluidly sealing the cooling channel formed in the cooling section.

In some embodiments, a cooling ring assembly for cooling a substrate support may include a cooling section having a top surface, a bottom surface having a cooling channel formed in the bottom surface, and a first central opening, and a cap having a second central opening, wherein the cap is coupled to the bottom surface of the cooling section and fluidly seals the cooling channel formed in the cooling section, and wherein the first central opening and second central opening are substantially aligned.

In some embodiments, a process chamber for processing substrates may include a chamber body having an inner volume, a substrate support disposed in the inner volume, the substrate support including: an electrostatic chuck having a top substrate support surface and a bottom surface; an annular support ring having a central opening coupled to the bottom surface of the electrostatic chuck; an annular retention ring having a central opening disposed within the central opening of the annular support ring; and a cooling ring assembly disposed within the central opening of the annular retention ring and proximate the bottom surface of the electrostatic chuck, the cooling ring assembly including a cooling section having a top surface thermally coupled to the bottom surface of the electrostatic chuck, the cooling section having a cooling channel formed in a bottom surface of the cooling section, and a cap coupled to the bottom surface of the cooling section and fluidly sealing the cooling channel formed in the cooling section.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
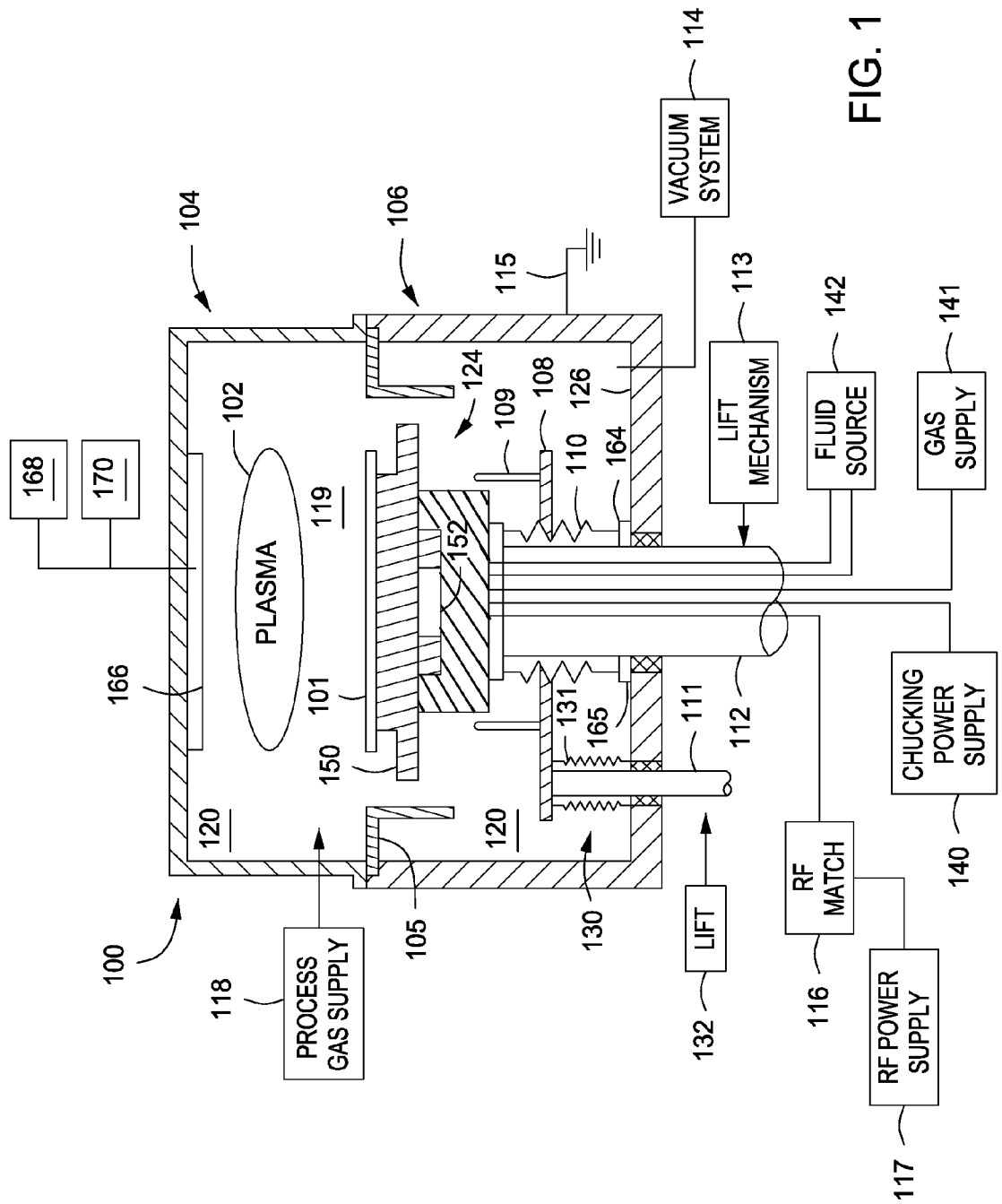
FIG. 1 is a process chamber suitable for use with the inventive substrate support chuck in accordance with some embodiments of the present invention.

To facilitate understanding, identical reference numerals have been used, where possible, to designate identical elements that are common to the figures. The figures are not drawn to scale and may be simplified for clarity. In this document, relational terms such as first and second, top and bottom, and the like may be used solely to distinguish one entity or action from another entity or action without necessarily requiring or implying any actual such relationship or order between such entities or actions. It is contemplated that elements and features of one embodiment may be beneficially incorporated in other embodiments without further recitation.

DETAILED DESCRIPTION

Exemplary embodiments consistent with the present invention advantageously provide the ability to process substrates which use lower process temperatures either to maintain certain characteristics of the film being deposited, or to limit thermal damage to films already deposited. In addition, embodiments consistent with the present invention advantageously provide a substrate support chuck capable of removing extra heat from substrate during higher energy processes used to deposit thick films in reasonable time span, or to deposit difficult to sputter materials. In addition, in exemplary embodiments consistent with the present invention, the process energy can be advantageously increased without raising the wafer temperature, thereby allowing the deposition rate to be increased leading to a reduction in process time and a subsequent increase in chamber productivity.

FIG. 1 is a schematic cross-sectional view of plasma processing chamber in accordance with some embodiments of the present invention. In some embodiments, the plasma processing chamber is a physical vapor deposition (PVD) processing chamber. However, other types of processing chambers that utilize electrostatic chucks may also be used with the inventive apparatus.

The chamber 100 is a vacuum chamber which is suitably adapted to maintain sub-atmospheric pressures within a chamber interior volume 120 during substrate processing. The chamber 100 includes a chamber body 106 covered by a dome 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and dome 104 may be made of metal, such as aluminum. The chamber body 106 may be grounded via a coupling to ground 115.

A substrate support 124 may be disposed within the chamber interior volume 120 for supporting and chucking a substrate 101, such as a semiconductor wafer or other such substrate as may be electrostatically retained. The substrate support 124 may generally include an electrostatic chuck 150 (described in more detail below) and a hollow support shaft 112 for supporting the electrostatic chuck 150. The hollow support shaft 112 provides a conduit to provide process gases, fluids, heat transfer fluids, power, or the like, to the electrostatic chuck 150.

In some embodiments, the hollow support shaft 112 is coupled to a lift mechanism 113 which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 which contacts bottom surface 126 to help prevent loss of chamber vacuum.

The hollow support shaft 112 provides a conduit for coupling a coolant fluid supply 142, a gas supply 141, a chucking power supply 140, and one or more RF sources 117 (e.g., an RF plasma power supply and/or an RF bias power supply) to the electrostatic chuck 150. In some embodiments, the RF power supply 117 may be coupled to the electrostatic chuck via an RF matching network 116.

A substrate lift 130 may include lift pins 109 mounted on a platform 108 connected to a shaft 111 which is coupled to a second lift mechanism 132 for raising and lowering the substrate lift 130 so that the substrate 101 may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114, which may include a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF power supply 117) to a process gas via one or more electrodes (described below) within the chamber interior volume 120 to ignite the process gas and create the plasma 102. Alternatively or in combination, a plasma may be formed in the chamber interior volume 120 by other methods. In some embodiments, a bias power may be provided from a bias power supply (e.g., RF power supply 117) to one or more electrodes (described below) disposed within the substrate support or the electrostatic chuck 150 to attract ions from the plasma towards the substrate 101.

In some embodiments, for example where the chamber 100 is a PVD chamber, a target 166 comprising a source material to be deposited on a substrate 101 may be disposed above the substrate and within the chamber interior volume 120. The target 166 may be supported by a grounded conductive portion of the chamber 100, for example an aluminum adapter through a dielectric isolator.

A controllable DC power source 168 may be coupled to the chamber 100 to apply a negative voltage, or bias, to the target 166. An RF power supply 117A-B may be coupled to the substrate support 124 in order to induce a negative DC bias on the substrate 101. In addition, in some embodiments, a negative DC self-bias may form on the substrate 101 during processing. In other applications, the substrate support 124 may be grounded or left electrically floating. In some embodiments, an RF power supply 170 may also be coupled to the chamber 100 to apply RF power to the target 166 to facilitate control of the radial distribution of a deposition rate on substrate 101. In operation, ions in the plasma 102 created in the chamber 100 react with the source material from the target 166. The reaction causes the target 166 to eject atoms of the source material, which are then directed towards the substrate 101, thus depositing material.

In some embodiments, a rotatable magnetron (not shown) may be positioned proximate a back surface of the target 166. The magnetron may include a plurality of magnets configured to produce a magnetic field within the chamber 100, generally parallel and close to the surface of the target 166 to trap electrons and increase the local plasma density, which in turn increases the sputtering rate. The magnets produce an electromagnetic field around the top of the chamber 100, and are rotated to rotate the electromagnetic field which influences the plasma density of the process to more uniformly sputter the target 166.

For example, the electrostatic chuck 150 may comprise a dielectric member having a support surface for supporting a substrate having a given width (e.g., 150 mm, or other sized silicon wafers or other substrates). The substrate support 124 may include a cooling ring assembly 152 disposed beneath the electrostatic chuck 150 to cool the electrostatic chuck 150. Coolant may be supplied to the cooling ring assembly 152 via a coolant fluid supply 142. The cooling ring assembly 152 is discussed below in detail with respect to FIGS. 2 and 3.

Figure 2:
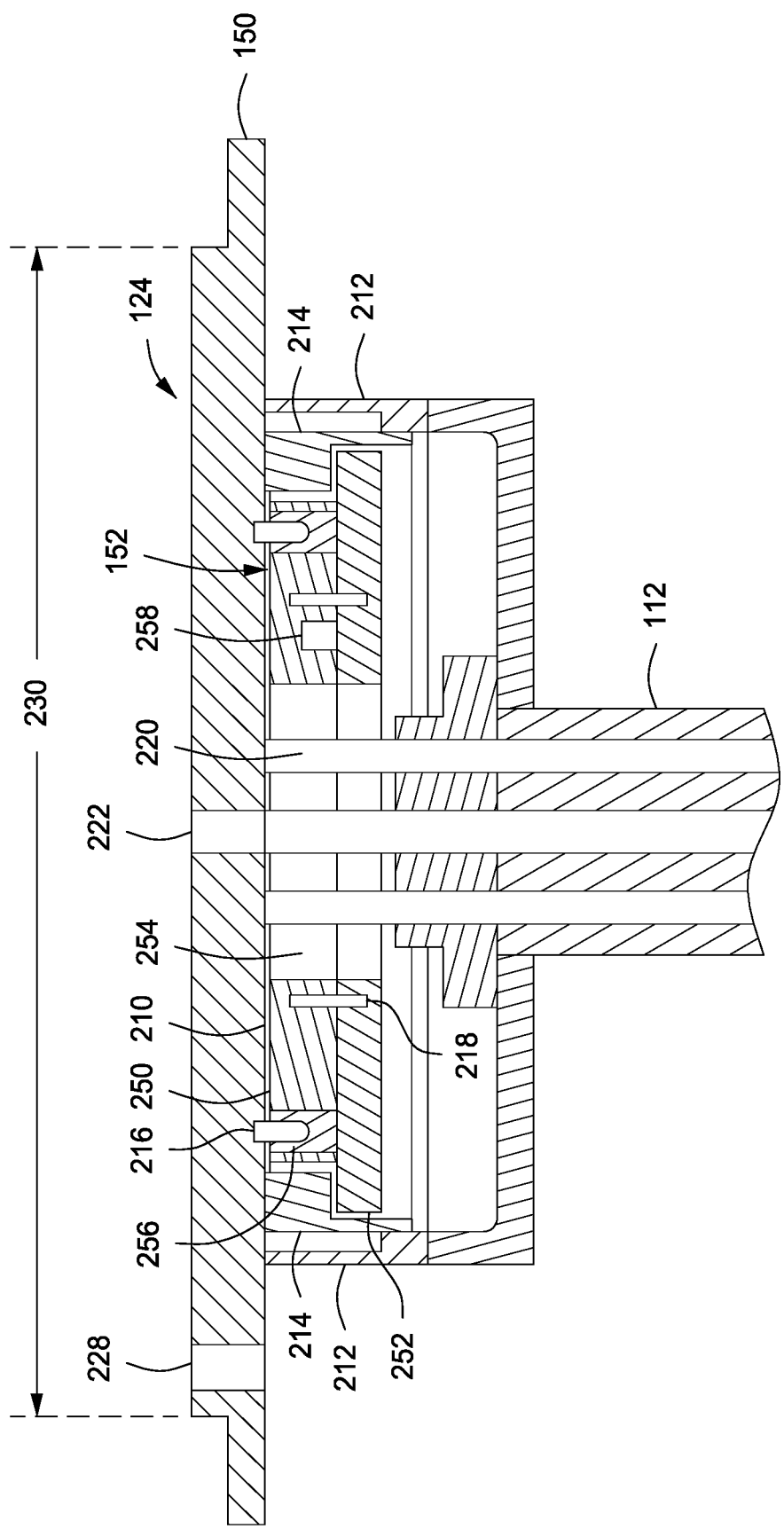
FIG. 2 is a schematic cross-sectional side view of a substrate in accordance with some embodiments of the present invention.

FIG. 2 depicts a schematic cross-sectional side view of substrate support 124. As discussed above with respect to FIG. 1, the substrate support 124 includes an electrostatic chuck 150. In some embodiments, the electrostatic chuck 150 may be formed from a dielectric material such as a ceramic, although other materials may be used. In some embodiments, a low operating temperature aluminum nitride (for example, AN2010 by KYOCERA) may be used which has a thermal conductivity of greater or equal than 150 W/m-K. This greatly aids in the removal of heat from the substrate 101 and transferring this heat to the cooling ring assembly 152.

In some embodiments, a substrate support surface of the electrostatic chuck 150 may have a diameter 230 of about 140 to about 160 mm to support a 150 mm substrate 101. In some embodiments, the diameter 230 may be about 144 mm to support a 150 mm substrate 101. Other diameters may be used as desired to support different sized substrates. The electrostatic chuck 150 may include one or more lift pin holes 228 formed though the body of the electrostatic chuck 150 which may have lift pins disposed therethrough to raise and lower a substrate 101 onto the top surface of the electrostatic chuck 150. In some embodiments, the electrostatic chuck 150 may also have a gas hole 222 formed though the body of the electrostatic chuck 150 which may be used to supply a gas to gas channels that may be formed on the top surface of the electrostatic chuck 150, thereby providing the gas to the backside of the substrate 101 when disposed on the electrostatic chuck 150.

An annular support ring 212 may be coupled to a backside of the electrostatic chuck 150. In some embodiments, the annular support ring 212, having a central opening, may be brazed or welded to the backside of the electrostatic chuck 150. In some embodiments, the annular support ring 212 may be fabricated from an iron-nickel-cobalt alloy, or any other material having a similar coefficient of thermal expansion and structural properties. An annular retention ring 214 having a central opening may be disposed within the central opening of the support ring 212. The retention ring 214 may be coupled to the annular support ring 212.

A cooling ring assembly 152 may be disposed proximate a bottom surface of the electrostatic chuck 150 to cool the electrostatic chuck 150. In some embodiments, the cooling ring assembly 152 has a diameter that is smaller than the substrate support surface of the electrostatic chuck 150. In some embodiments, the cooling ring assembly 152 has a diameter that is smaller than a diameter along which the lift pin holes 228 are located. In some embodiments, the cooling ring assembly 152 may be thermally coupled to the electrostatic chuck 150 via a thermal gasket 210. In some embodiments, the thermal gasket 210 may be layer of directionally conductive (e.g., vertically) graphite material. This advantageously improves the thermal conduction to the cooling ring. Conventional cooling rings typically rely on contact between the cooling ring and ceramic which is not ideal as the surfaces are not 100% flat leading to minute air gaps and poor thermal conductivity. Other thermal gasketing materials are also possible such as thermal paste.

In some embodiments, the cooling ring assembly 152 may include a cooling section 250 coupled to a cap 252. In some embodiments, the cooling section 250 may be formed from copper. In other embodiments, other materials such as stainless steel, aluminum, or the like may be used depending on the thermal conductivity desired and the processing environment in which the cooling ring 152 will be operating in. In some embodiment, the thermal conductivity of the cooling section is about 300 W/m-K or greater. In some embodiments, the cap 252 may be formed from stainless steel, or other materials that may facilitate welding of cooling fluid feed tubes. In some embodiments, the cooling section 250 and cap 252 may be bolted, brazed, welded, pinned, etc. together. In some embodiments alignment pins 218 may be used to align the cooling section 250 and cap 252.

Figure 3:
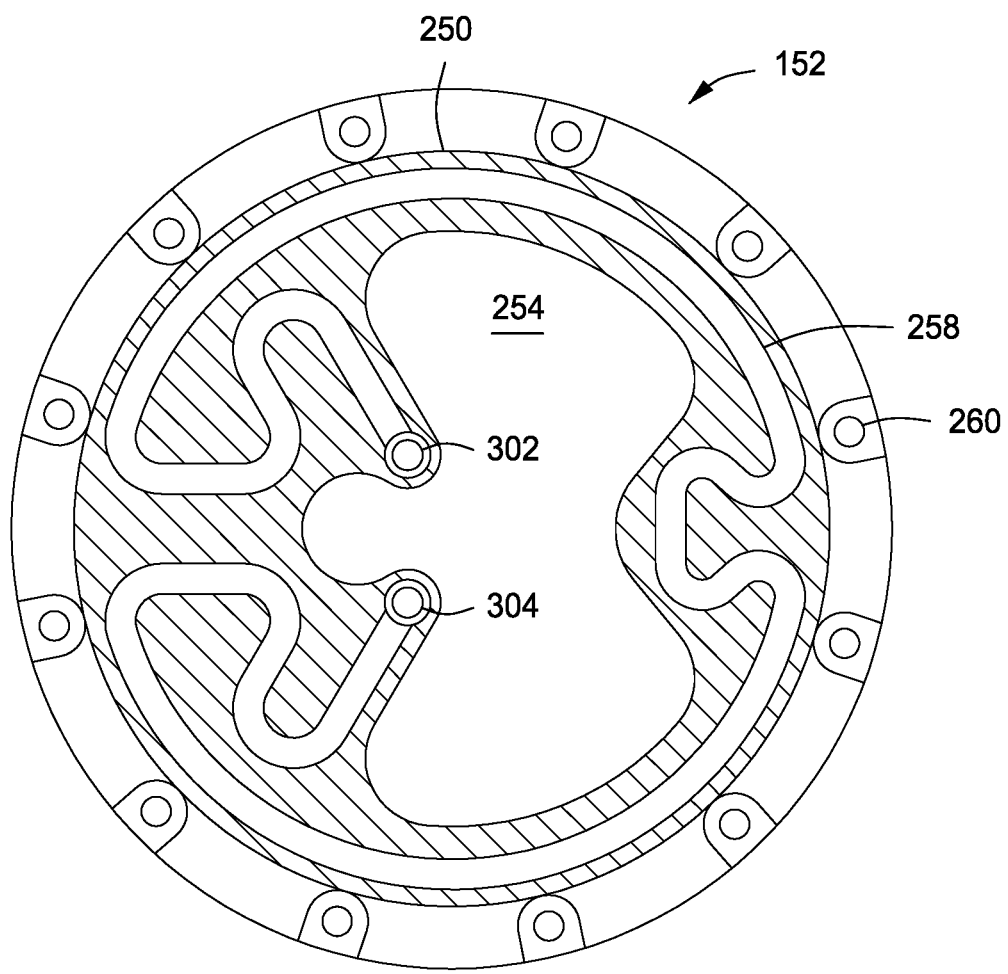
FIG. 3 is a schematic cross-sectional bottom view of a cooling ring assembly in accordance with some embodiments of the present invention.

The cooling section 250 includes a coolant channel 258 for flowing a coolant therethrough. As shown in FIG. 3, which is a schematic view of the bottom of cooling section 250, a first end of the coolant channel 258 may be couple to a first cooling supply tube 302 for providing coolant to the cooling section 250. In some embodiments, the coolant may flow through coolant channel 258, which may be formed as a groove in the body of the cooling section 250 in a serpentine configuration. A second end of the coolant channel 258 may be coupled to a cooling fluid outlet tube 304 to remove the heated coolant from the cooling ring assembly 152. In some embodiments, the cap 252 is coupled to the cooling section 250 in such a way to prevent the coolant from leaking from coolant channel 258. In some embodiments, the cap 252 may include a central opening 262 that aligns with and has the same shape and size as opening 254 in the cooling section 250.

In some embodiments, the cooling section 250 may include a plurality of openings 256 with alignments pins 216 disposed therein for aligning the cooling ring assembly 152 to the electrostatic chuck 150. The cooling ring assembly 152 may have an central opening 254 disposed through both the cooling section 250 and cap 252 to allow for various contacts/piping/connections to the electrostatic chuck 150 to pass through. For example, in some embodiments, spring-retained thermocouples 220 may pass through opening 254 to connect to a backside of the electrostatic chuck 150. Similarly, in some embodiments, gas/electrical lines 232 may pass through opening 254 to connect to the electrostatic chuck 150. The cooling ring assembly 152 may include a plurality of fastener holes 260 disposed about an outer diameter of the ring assembly 152.

While the foregoing is directed to embodiments of the present invention, other and further embodiments of the invention may be devised without departing from the basic scope thereof.

The invention claimed is:

1. A cooling ring assembly for cooling a substrate support, comprising:
   a cooling section having a top surface, a bottom surface having a cooling channel formed in the bottom surface, and a first central opening, wherein the cooling section is formed from a material having a thermal conductivity of greater or equal than 300 W/m-K;
   a cap coupled to the bottom surface of the cooling section that directly covers and fluidly sealing the cooling channel formed in the cooling section, wherein the cap includes a second central opening; and
   a thermal gasket coupled to the top surface of the cooling section, and wherein the thermal gasket is a layer of vertically conductive graphite material,
   wherein the first and second central openings have a non-circular shape configured to accommodate a plurality of piping and/or connections to pass through, wherein the second central opening aligns with and has the same shape and size as the first central opening in the cooling section, wherein the cooling channel is formed about a periphery of the non-circular first central opening.

2. A cooling ring assembly of claim 1, wherein the cooling channel if formed in a serpentine configuration about a periphery of the first central opening.

3. The cooling ring assembly of claim 1, wherein the cap is formed from stainless steel.

4. The cooling ring assembly of claim 1, wherein the cooling section is formed from one of copper, steel, or aluminum.

5. The cooling ring assembly of claim 1, the cooling section and cap are one of bolted, brazed, welded, or pinned together.

6. The cooling ring assembly of claim 1, further comprising alignment pins that align the cooling section and cap.

7. The cooling ring assembly of claim 1, further comprising:
- a coolant supply tube fluidly coupled to a first end of the cooling channel; and
- a coolant outlet tube fluidly coupled to a second end of the cooling channel.

8. A process chamber for processing substrates, comprising:
- a chamber body having an inner volume;
- a substrate support disposed in the inner volume, the substrate support including:
  - an electrostatic chuck having a top substrate support surface and a bottom surface;
  - an annular support ring having a central opening coupled to the bottom surface of the electrostatic chuck;
  - an annular retention ring having a central opening disposed within the central opening of the annular support ring; and
  - a cooling ring assembly disposed within the central opening of the annular retention ring and proximate the bottom surface of the electrostatic chuck, the cooling ring assembly including:
    - a cooling section having a top surface, a bottom surface having a cooling channel formed in the bottom surface, and a first central opening, wherein the cooling section is formed from a material having a thermal conductivity of greater or equal than 300 W/m–K; and
    - a cap coupled to the bottom surface of the cooling section that directly covers and fluidly sealing the cooling channel formed in the cooling section, wherein the cap includes a second central opening, wherein the first and second central openings have a non-circular shape configured to accommodate a plurality of piping and/or connections to pass through, wherein the second central opening aligns with and has the same shape and size as the first central opening in the cooling section, and wherein the cooling channel is formed about a periphery of the non-circular first central opening, wherein the cooling ring assembly is thermally coupled to the electrostatic chuck via a thermal gasket, and wherein the thermal gasket is a layer of vertically conductive graphite material.

9. The process chamber of claim 8, wherein the cooling channel formed about a periphery of the first central opening in the cooling section.

10. The process chamber of claim 8, further comprising:
- a coolant supply tube fluidly coupled to a first end of the cooling channel; and
- a coolant outlet tube fluidly coupled to a second end of the cooling channel.

11. The process chamber of claim 8, wherein the cap is formed from stainless steel.

12. The process chamber of claim 8, wherein the cooling section is formed from one of copper, steel, or aluminum.

13. The process chamber of claim 8, the cooling section and cap are one of bolted, brazed, welded, or pinned together.

14. The process chamber of claim 8, further comprising alignment pins that align the cooling section and cap.

15. The process chamber of claim 8, wherein the top surface of the cooling section includes a plurality of openings with alignments pins disposed therein that align the cooling ring assembly to the electrostatic chuck.

16. The process chamber of claim 8, further comprising at least one thermocouple disposed through the first and second central openings and coupled to the bottom surface of the electrostatic chuck.

17. The process chamber of claim 16, wherein the at least one thermocouple is a spring-retained thermocouple.

18. The process chamber of claim 8, further comprising a plurality of thermocouples disposed through the first and second central openings and coupled to the bottom surface of the electrostatic chuck.

* * * * *